United States Patent
Itsuki et al.

(10) Patent No.: US 11,566,326 B2
(45) Date of Patent: *Jan. 31, 2023

(54) VAPORIZABLE SOURCE MATERIAL CONTAINER AND SOLID VAPORIZATION/SUPPLY SYSTEM USING THE SAME

(71) Applicant: KOJUNDO CHEMICAL LABORATORY CO., LTD., Sakado (JP)

(72) Inventors: Atsushi Itsuki, Sakado (JP); Hiroshi Matsumoto, Sakado (JP)

(73) Assignee: KOJUNDO CHEMICAL LABORATORY CO., LTD., Sakado (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/424,974

(22) PCT Filed: Feb. 5, 2020

(86) PCT No.: PCT/JP2020/004367
§ 371 (c)(1),
(2) Date: Jul. 22, 2021

(87) PCT Pub. No.: WO2020/162499
PCT Pub. Date: Aug. 13, 2020

(65) Prior Publication Data
US 2022/0090261 A1    Mar. 24, 2022

(30) Foreign Application Priority Data
Feb. 7, 2019    (JP) ............................. JP2019-020583

(51) Int. Cl.
*C23C 16/448*    (2006.01)
*C23C 16/455*    (2006.01)
(Continued)

(52) U.S. Cl.
CPC .......... *C23C 16/4481* (2013.01); *C23C 16/08* (2013.01); *C23C 16/34* (2013.01);
(Continued)

(58) Field of Classification Search
CPC ......... B01D 29/15; B01D 7/00; Y10S 261/65; Y10T 137/87587; Y10T 137/87917;
(Continued)

(56) References Cited

U.S. PATENT DOCUMENTS

| | | | |
|---|---|---|---|
| 529,684 A  * | 11/1894 | Rogers ................... | F02M 21/00 261/126 |
| 1,803,306 A  * | 4/1931 | Stengel .................. | B01J 8/0453 422/199 |

(Continued)

FOREIGN PATENT DOCUMENTS

| | | |
|---|---|---|
| CN | 1542918 A | 11/2004 |
| CN | 101065516 A | 10/2007 |

(Continued)

OTHER PUBLICATIONS

Notification of Reason for Refusal dated Oct. 29, 2021, by the Korean Intellectual Property Office in Korean Patent Application No. 10-2021-7028595 and an English translation of the Notification. (12 pages).

(Continued)

*Primary Examiner* — Jeffrie R Lund
(74) *Attorney, Agent, or Firm* — Buchanan, Ingersoll & Rooney PC

(57) ABSTRACT

Provided is a vaporizable source material container having excellent corrosion resistance. The vaporizable source material container for storing and vaporizing a metal halide for thin film deposition S includes: a container main body including a container wall; a lid body provided with a carrier gas inlet and a mixed gas outlet; fastening members for (Continued)

fixing the container main body with the lid body; and joint members, wherein the container wall of the container main body is fabricated of copper with 99 to 99.9999% purity, aluminum with 99 to 99.9999% purity, or titanium with 99 to 99.9999% purity, and the container main body, the lid body, the fastening members and the joint members are each treated by fluorocarbon polymer coating and/or by electrolytic polishing.

9 Claims, 5 Drawing Sheets

(51) Int. Cl.
  *C23C 16/44*    (2006.01)
  *C23C 16/08*    (2006.01)
  *C23C 16/34*    (2006.01)
  *C23C 16/40*    (2006.01)

(52) U.S. Cl.
  CPC .......... *C23C 16/403* (2013.01); *C23C 16/405* (2013.01); *C23C 16/4404* (2013.01); *C23C 16/45544* (2013.01); *C23C 16/45565* (2013.01)

(58) Field of Classification Search
  CPC ..... C23C 14/00; C23C 14/243; C23C 14/246; C23C 14/543; C23C 16/08; C23C 16/18; C23C 16/34; C23C 16/40; C23C 16/4404; C23C 16/4412; C23C 16/448; C23C 16/4481; C23C 16/4482; C23C 16/4483; C23C 16/4485; C23C 16/4486; C23C 16/4487; C23C 16/455; C23C 16/45544; C23C 16/45561; C23C 16/481; C23C 16/52; C23C 16/22; C23C 16/4402; C23C 16/405; C25F 3/16; C30B 25/14; C30B 25/165; F17C 2203/03; F17C 2205/0341; F17C 2205/037; F17C 2250/0631; F17C 3/02; F17C 6/00; F17C 7/00; H01L 21/205; H01L 21/31; H01L 51/0008
  See application file for complete search history.

(56) References Cited

U.S. PATENT DOCUMENTS

| | | | | |
|---|---|---|---|---|
| 3,438,803 | A * | 4/1969 | Alten | C03C 17/245 65/60.5 |
| 3,459,668 | A * | 8/1969 | Schmit | H01L 21/223 252/62.3 R |
| 3,832,222 | A * | 8/1974 | Crisler | G21C 21/02 376/901 |
| 4,707,210 | A * | 11/1987 | Misumi | C23C 16/4401 156/345.43 |
| 4,947,790 | A * | 8/1990 | Gartner | C23C 16/4481 118/724 |
| 5,311,421 | A * | 5/1994 | Nomura | G05B 13/0285 706/14 |
| 5,314,780 | A | 5/1994 | Takei et al. | |
| 5,558,687 | A * | 9/1996 | Cain | C23C 16/4483 261/153 |
| 5,618,580 | A * | 4/1997 | Oshima | B01J 12/02 423/625 |
| 5,630,878 | A * | 5/1997 | Miyamoto | C23C 16/4485 118/725 |
| 6,135,433 | A * | 10/2000 | Nurmi | C23C 16/448 261/138 |
| 6,155,540 | A * | 12/2000 | Takamatsu | C23C 16/4481 261/78.2 |
| 6,270,839 | B1 * | 8/2001 | Onoe | C23C 16/4481 34/493 |
| 6,455,414 | B1 * | 9/2002 | Hillman | C23C 16/14 438/628 |
| 6,884,295 | B2 | 4/2005 | Ishii et al. | |
| 7,651,570 | B2 | 1/2010 | Brcka | |
| 8,858,710 | B2 | 10/2014 | Mizunaga et al. | |
| 9,297,071 | B2 | 3/2016 | Kanjolia et al. | |
| 9,725,805 | B2 | 8/2017 | Kobrin et al. | |
| 10,526,707 | B2 | 1/2020 | Noda et al. | |
| 11,166,441 | B2 * | 11/2021 | Birtcher | B65D 51/24 |
| 2001/0046792 | A1 * | 11/2001 | Takahashi | H01L 21/02249 438/786 |
| 2002/0005348 | A1 * | 1/2002 | Xu | H01J 37/3233 204/192.12 |
| 2003/0031791 | A1 * | 2/2003 | Sakamoto | C23C 16/14 427/255.39 |
| 2003/0033984 | A1 * | 2/2003 | Carpenter | C23C 16/455 118/725 |
| 2004/0025370 | A1 * | 2/2004 | Guenther | C23C 16/4481 34/576 |
| 2004/0083962 | A1 * | 5/2004 | Bang | C23C 16/4481 118/715 |
| 2004/0216669 | A1 | 11/2004 | Takamatsu et al. | |
| 2005/0006799 | A1 * | 1/2005 | Gregg | C23C 16/4481 261/DIG. 65 |
| 2005/0072357 | A1 * | 4/2005 | Shero | C23C 16/4483 118/726 |
| 2005/0087135 | A1 * | 4/2005 | Hioki | B08B 9/0321 118/715 |
| 2005/0249649 | A1 * | 11/2005 | Hubbell | B01F 23/211 422/228 |
| 2006/0112882 | A1 * | 6/2006 | Suzuki | C23C 16/16 118/726 |
| 2006/0112883 | A1 * | 6/2006 | Suzuki | C23C 16/4481 118/726 |
| 2006/0115593 | A1 * | 6/2006 | Suzuki | C23C 16/16 427/430.1 |
| 2006/0121198 | A1 * | 6/2006 | Shenai-Khatkhate | C23C 16/4481 427/255.28 |
| 2006/0185597 | A1 * | 8/2006 | Suzuki | C23C 16/4481 118/726 |
| 2006/0185598 | A1 * | 8/2006 | Suzuki | C23C 16/4481 118/726 |
| 2006/0213441 | A1 * | 9/2006 | Kobrin | B05D 1/60 118/726 |
| 2006/0219168 | A1 * | 10/2006 | Brcka | C23C 16/4481 118/726 |
| 2008/0061477 | A1 | 3/2008 | Capizzo | |
| 2008/0191153 | A1 * | 8/2008 | Marganski | C23C 14/48 134/107 |
| 2008/0202426 | A1 * | 8/2008 | Suzuki | C23C 16/4481 118/726 |
| 2009/0020072 | A1 * | 1/2009 | Mizunaga | H01L 21/67017 118/712 |
| 2010/0119734 | A1 * | 5/2010 | Choi | C23C 16/4481 118/724 |
| 2010/0236480 | A1 * | 9/2010 | Hara | C23C 16/4481 137/551 |
| 2011/0015440 | A1 * | 1/2011 | Shioji | C07F 9/5442 568/10 |
| 2011/0206585 | A1 * | 8/2011 | Hara | F27D 17/004 423/215.5 |
| 2012/0266967 | A1 * | 10/2012 | Kanjolia | C23C 16/4481 137/1 |
| 2015/0021756 | A1 * | 1/2015 | Adachi | H01L 23/473 257/714 |
| 2015/0191819 | A1 | 7/2015 | Hendrix et al. | |
| 2015/0218699 | A1 * | 8/2015 | Noda | B01J 8/1818 118/725 |
| 2015/0240355 | A1 * | 8/2015 | Nasman | C23C 16/4483 239/136 |
| 2016/0046408 | A1 * | 2/2016 | Girard | C23C 16/4481 427/236 |
| 2016/0208382 | A1 * | 7/2016 | Takahashi | C23C 16/45544 |
| 2016/0281231 | A1 * | 9/2016 | Moroi | C23C 16/14 |
| 2016/0305019 | A1 * | 10/2016 | Birtcher | C23C 16/45561 |

(56) References Cited

U.S. PATENT DOCUMENTS

| | | | |
|---|---|---|---|
| 2017/0306486 A1* | 10/2017 | Quinn | C23C 16/4481 |
| 2018/0044800 A1* | 2/2018 | Hendrix | C23C 16/045 |
| 2018/0135176 A1* | 5/2018 | Morikawa | C23C 16/4587 |
| 2018/0182928 A1 | 6/2018 | Namie | |
| 2018/0291502 A1* | 10/2018 | Kitagawa | C23C 16/52 |
| 2019/0055649 A1* | 2/2019 | Lee | C23C 16/4483 |
| 2019/0084733 A1* | 3/2019 | Chatterton | B65D 53/02 |
| 2020/0016558 A1* | 1/2020 | Birtcher | B01J 4/001 |
| 2020/0340110 A1* | 10/2020 | Hendrix | H01L 21/67 |
| 2020/0362456 A1* | 11/2020 | Nakagawa | C23C 16/4481 |
| 2021/0101089 A1* | 4/2021 | Tarutani | C01G 41/04 |
| 2021/0324510 A1* | 10/2021 | Kuwano | C23C 16/505 |
| 2021/0371977 A1* | 12/2021 | Nakagawa | C23C 16/4481 |
| 2022/0064786 A1 | 3/2022 | Itsuki et al. | |
| 2022/0090261 A1 | 3/2022 | Itsuki et al. | |

FOREIGN PATENT DOCUMENTS

| | | | | |
|---|---|---|---|---|
| CN | 104487608 A | | 4/2015 | |
| CN | 106048558 A | | 10/2016 | |
| JP | H05267196 A | | 10/1993 | |
| JP | H09217166 A | | 8/1997 | |
| JP | H11-111644 A | | 4/1999 | |
| JP | 2005131632 A | | 5/2005 | |
| JP | 2009084625 A | | 4/2009 | |
| JP | 2010502833 A | | 1/2010 | |
| JP | 2010042330 A | | 2/2010 | |
| JP | 2012052669 A | | 3/2012 | |
| JP | 2016000866 A | | 1/2016 | |
| JP | 2016134569 A | | 7/2016 | |
| JP | 2016208026 A | | 12/2016 | |
| JP | 2017191826 A | | 10/2017 | |
| JP | 2018506859 A | | 3/2018 | |
| JP | 6425850 B1 | | 11/2018 | |
| JP | 6425850 B1 * | | 11/2018 | B01J 7/00 |
| KR | 10-2007-0031723 A | | 3/2007 | |
| KR | 20070031723 A * | | 3/2007 | H01L 21/67034 |
| KR | 10-2008-0102184 A | | 11/2008 | |
| KR | 20200007753 A * | | 1/2020 | C23C 16/4481 |
| KR | 20210075050 A * | | 6/2021 | C23C 16/4481 |
| WO | 2014069174 A1 | | 5/2014 | |
| WO | 2019/023011 A1 | | 1/2019 | |
| WO | WO-2020162499 A1 * | | 8/2020 | C23C 16/40 |
| WO | WO-2020162500 A1 * | | 8/2020 | C23C 16/40 |

OTHER PUBLICATIONS

Notification of Reason for Refusal dated Nov. 17, 2021, by the Korean Intellectual Property Office in corresponding Korean Patent Application No. 10-2021-7028598 and an English translation of the Notification (13 pages).

International Search Report (PCT/ISA/210) with translation and Written Opinion (PCT/ISA/237) dated Mar. 10, 2020, by the Japanese Patent Office as the International Searching Authority for International Application No. PCT/JP2020/004367. (12 pages).

International Search Report (PCT/ISA/210) with translation and Written Opinion (PCT/ISA/237) dated Mar. 10, 2020, by the Japanese Patent Office as the International Searching Authority for International Application No. PCT/JP2020/004368. (11 pages).

First Office Action dated Jan. 28, 2022, by the State Intellectual Property Office of the People's Republic of China in corresponding Chinese Patent Application No. 202080013070.4, and an English translation of the Office Action. (17 pages).

First Office Action dated Dec. 30, 2021, by the State Intellectual Property Office of the People's Republic of China in Chinese Patent Application No. 202080013066.8, and an English translation of the Office Action. (15 pages).

Office Action dated Jan. 20, 2022, by the U.S Patent and Trademark Office in U.S. Appl. No. 17/424,968. (25 pages).

Pinal Office Action dated Sep. 15, 2022, by the U.S. Patent and Trademark Office in U.S. Appl. No. 14/424,968 (12 pages).

Office Action dated Apr. 28, 2022, by the U.S Patent and Trademark Office in U.S. Appl. No. 17/424,968. (21 pages).

* cited by examiner

VAPORIZABLE SOURCE MATERIAL CONTAINER AND SOLID VAPORIZATION/SUPPLY SYSTEM USING THE SAME

TECHNICAL FIELD

This invention relates to a vaporizable source material container, and to also a solid vaporization/supply system using the vaporizable source material container. More specifically, this invention relates to a vaporizable source material container having excellent corrosion resistance, and to a solid vaporization/supply system using the vaporizable source material container.

BACKGROUND ART

Vaporizable source material containers are conventionally known as the containers for storing a vaporizable source material, for example, in a chemical vapor deposition (CVD) method, where stainless steel and the like have been disclosed as materials out of which a vaporizer main body of the vaporizable source material containers is fabricated (refer to PTL 1).

CITATION LIST

Patent Literature

PTL 1: JP 2016-866 A

SUMMARY OF INVENTION

Technical Problem

However, in such a vaporizer as the one disclosed in PTL 1, stainless steel is employed for its container wall. The container wall made of stainless steel has good thermal conductivity but has an issue of insufficient corrosion resistance. While stainless steel, for example, is corrosion resistant, it may be slightly corroded when getting in contact with a vaporizable source material, and a very small amount of impurity is incorporated in the vaporizable source material. Further, even when other materials such as Hastelloy are employed, a very small amount of impurity are likely to be incorporated in the vaporizable source material similarly to the case of stainless steel.

In recent years, use of metal halides as more reactive vaporizable source material has been studied. Such metal halides generate acid gases such as hydrogen chloride by reacting with water, which raises a problem that such acid gases cause more remarkable corrosion of the vaporizable source material container.

Meanwhile, recently, there has been a demand for much higher performance of semiconductor products. Accordingly, a higher purity (that is, a lower rate of impurity included) has been required for vaporizable source materials. When an atomic layer deposition (ALD) method is used for depositing a thin film, the thin film is required to be defect free and uniform at the atomic level. Therefore it is necessary to reduce the amount of impurity incorporated in the vaporizable source material to the utmost limit. For these reasons, measures against corrosion of the vaporizable source material container have become further important.

The present invention has been made in view of the above-described problems of the prior art, and accordingly provides a vaporizable source material container having excellent corrosion resistance and a solid vaporization/supply system using the vaporizable source material container.

Solution to Problem

According to the present invention, a vaporizable source material container and a solid vaporization/supply system using the vaporizable source material container, described below, are provided.

[1] A vaporizable source material container for storing and vaporizing a metal halide for thin film deposition to be used as a vaporizable source material, the vaporizable source material container including:

a container main body including a container wall;

a lid body configured to be detachably fixed to the container main body, and provided with a carrier gas inlet for introducing a carrier gas into the container main body and a mixed gas outlet for leading a mixed gas of the vaporized metal halide for thin film deposition with the carrier gas to the outside;

fastening members for fixing the container main body with the lid body; and joint members arranged at the carrier gas inlet and the mixed gas outlet of the lid body, wherein the container wall of the container main body is fabricated of copper with 99 to 99.9999% purity, aluminum with 99 to 99.9999% purity, or titanium with 99 to 99.9999% purity, and wherein the container main body, the lid body, the fastening members, and the joint members are each treated by fluorocarbon polymer coating and/or by electrolytic polishing on its surface.

[2] The vaporizable source material container according to [1], wherein the container wall has a double-wall structure composed of an inner wall member and an outer wall member, and wherein the carrier gas introduced from the carrier gas inlet is led into the container main body via a space between the inner and outer wall members of the double-wall structure.

[3] The vaporizable source material container according to [2], wherein an internal inlet for introducing the carrier gas having passed between the inner and outer wall members into the container main body is provided at a bottom surface portion of the inner wall member constituting the container wall.

[4] The vaporizable source material container according to any one of [1] to [3], wherein the fastening members are each composed of a bolt member inserted into a bolt insertion hole provided in both the container main body and the lid body, and of a nut member screwed and thereby fastened to the bolt member.

[5] The vaporizable source material container according to any one of [1] to [4] further including at least one plate-shaped shelf member suspended from the container main body.

[6] The vaporizable source material container according to [5], wherein at least one of the shelf members has a shower head structure provided with a plurality of through holes formed therein.

[7] The vaporizable source material container according to [5], wherein at least one of the shelf members is fabricated of a porous material.

[8] The vaporizable source material container according to any one of [1] to [7] further including one or more members having a spherical, spheroidal, leaf-like, spiral shape or another irregular shape, being made of aluminum or copper and having a maximum length of 1 to 30 mm in one direction in the container main body.

[9] The vaporizable source material container according to any one of [1] to [8], wherein the metal halide for thin film deposition to be used as the vaporizable source material is a compound represented by a general formula (1) described below;

$$MX_n \quad \text{General formula (1):}$$

(In the general formula (1), M represents any element among Al, Hf, Zr, Ta, W, Ga, La, Ce, Pr, Nd, Sm, Eu, Gd, Tb, Dy, Er, Tm, Yb and Co. X represents a halogen atom. n is the number of X atoms.).

[10] The vaporizable source material container according to any one of [1] to [9] to be used for thin film deposition by a chemical vapor deposition method.

[11] The vaporizable source material container according to any one of [1] to [9] to be used for thin film deposition by an atomic layer deposition method.

[12] The vaporizable source material container according to any one of [1] to [11] further including a valve arranged at a portion of a gas flow path located more downstream than the mixed gas outlet, the valve being a vacuum valve having a CV value (in terms of water) of 0.2 or more.

[13] A solid vaporization/supply system including: the vaporizable source material container according to any one of [1] to [12]; and the metal halide for thin film deposition to be used as the vaporizable source material that is stored in the vaporizable source material container, wherein the carrier gas is supplied from the carrier gas inlet of the lid body, and a mixed gas obtained by mixing the metal halide for thin film deposition having been vaporized and the carrier gas is supplied from the mixed gas outlet of the lid body.

[14] The solid vaporization/supply system according to [13] further including a carrier gas supply means for supplying the carrier gas into the container main body.

[15] The solid vaporization/supply system according to [13] or [14], wherein the container wall has a double wall structure composed of an inner wall member and an outer wall member, and wherein the mixed gas is produced by:

charging the metal halide for thin film deposition into the vaporizable source material container;

heating the metal halide for thin film deposition in the container main body by heating the container wall of the container main body;

introducing a carrier gas from the carrier gas inlet of the lid body, making the carrier gas pass through a space between the inner and outer wall members constituting the double wall structure of the heated container wall, and introducing the carrier gas thus heated into the container main body; and mixing the vaporized metal halide for thin film deposition with the carrier gas.

[16] The solid vaporization/supply system according to any one of [13] to [15],

Wherein a valve for opening and closing the gas flow path is arranged at a portion of a gas flow path for the mixed gas located more downstream than the mixed gas outlet, and wherein the valve is a vacuum valve having a CV value (in terms of water) of 0.2 or more.

Advantageous Effects of Invention

The vaporizable source material container according to the present invention has an effect of being highly corrosion resistant.

The solid vaporization/supply system according to the present invention includes the above-mentioned vaporizable source material container of the present invention, and has an effect of supplying a higher purity vaporizable source material at a high flow rate.

DESCRIPTION OF EMBODIMENTS

Hereinafter, descriptions will be given of embodiments for implementing the present invention, but the present invention is not limited to the embodiments described below. That is, it should be recognized that any embodiment obtained by appropriately applying modification, refinement or the like to the embodiments described below, in a range not departing from the aim of the present invention and based on general knowledge of a person skilled in the art, is embraced within the scope of the present invention.

Figure 1:
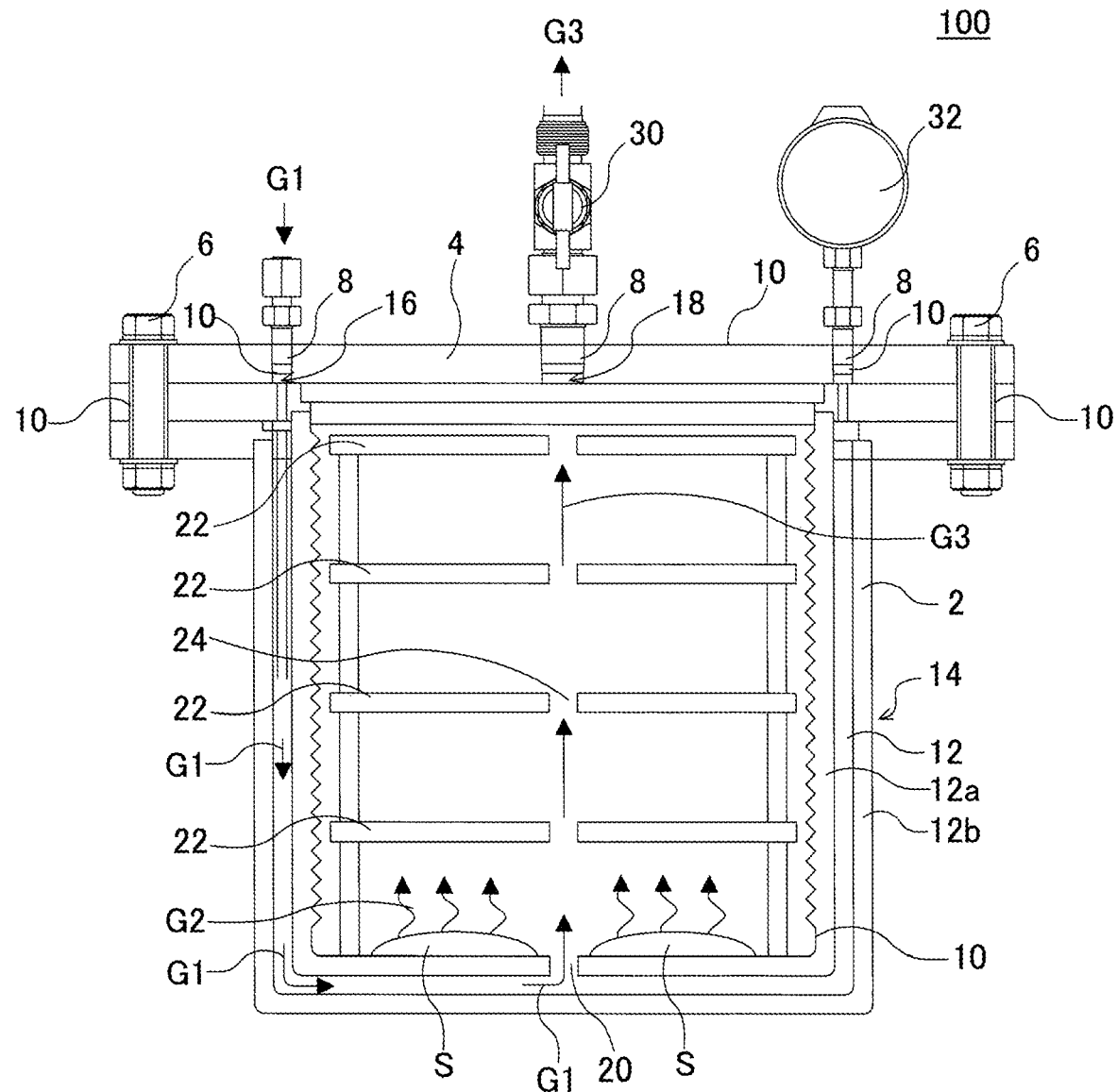
FIG. 1 is a cross-sectional diagram schematically showing an embodiment of a vaporizable source material container according to the present invention.
Figure 2:
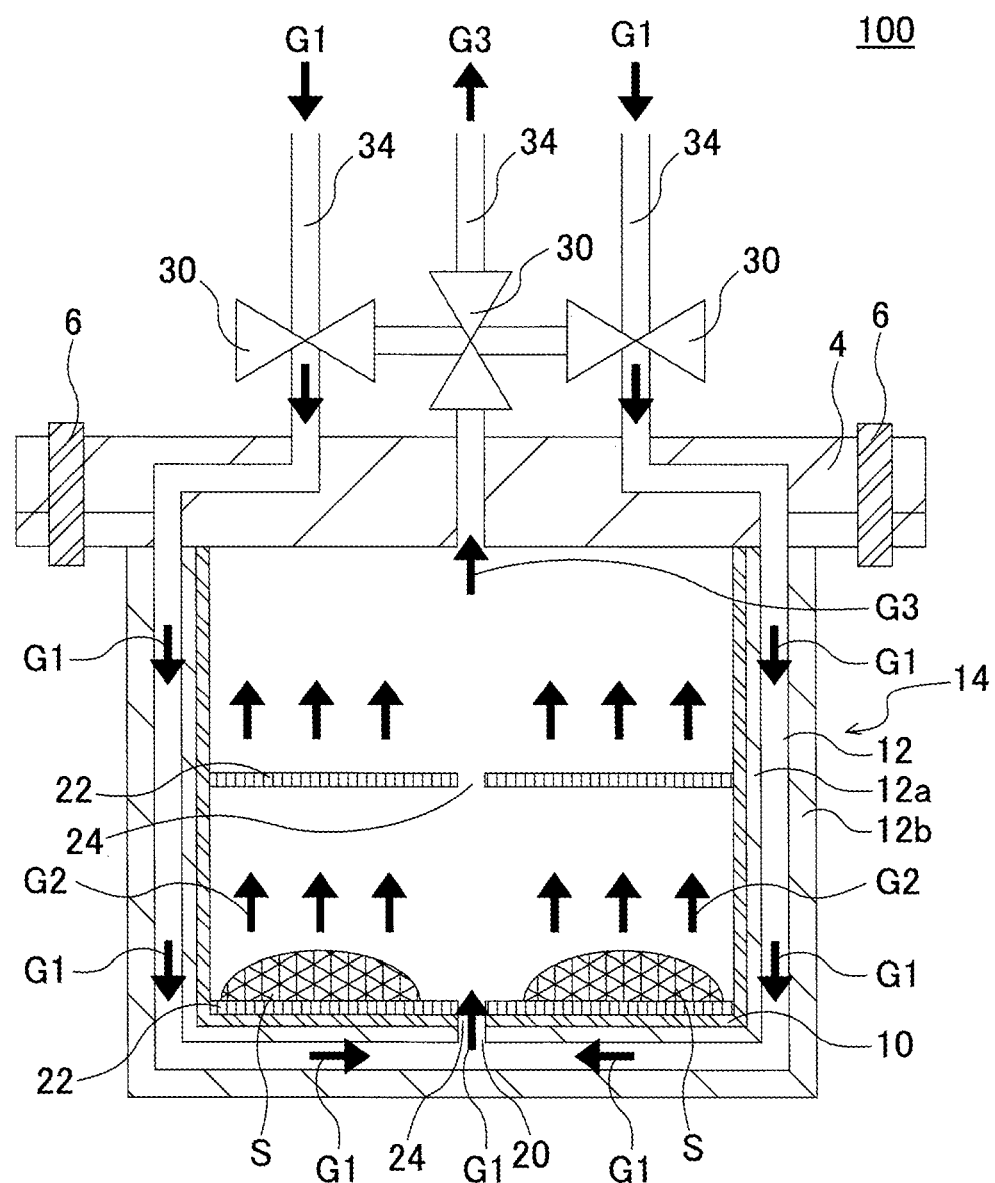
FIG. 2 is a schematic cross-sectional diagram for illustrating gas flow of a carrier gas, a vaporizable source material having been vaporized and a mixed gas, in an embodiment of the vaporizable source material container according to the present invention.

[1] Vaporizable Source Material Container:

An embodiment of a vaporizable source material container according to the present invention is shown in FIG. 1 as a vaporizable source material container 100. The vaporizable source material container 100 is a vaporizable source material container for storing and vaporizing a metal halide for thin film deposition S used as a vaporizable source material. The vaporizable source material container 100 includes a container main body 2, a lid body 4, fastening members 6, and joint members 8. FIG. 1 is a cross-sectional diagram schematically showing an embodiment of a vaporizable source material container according to the present invention. FIG. 2 is a schematic cross-sectional diagram for illustrating gas flow of a carrier gas G1, a vaporizable source material having been vaporized (that is, vaporized metal halide for thin film deposition G2) and a mixed gas G3, in the embodiment of a vaporizable source material container according to the present invention.

The container main body 2 has a container wall 12, and is a substantial main body part of the vaporizable source material container 100. The lid body 4 is configured to be detachably fixed to the container main body 2, and has a carrier gas inlet 16 for introducing the carrier gas G1 into the container main body 2 and a mixed gas outlet 18 for leading the mixed gas G3 of the vaporized metal halide for thin film deposition G2 with the carrier gas G1 to the outside. The fastening members 6 are those for fixing the container main body 2 with the lid body 4, for example, the fastening members 6 may be those each composed of a bolt member inserted into a bolt insertion hole provided in both the container main body 2 and the lid body 4, and of a nut member screwed and thereby fastened to the bolt member. The joint members 8 are those for coupling the carrier gas inlet 16 and the mixed gas outlet 18 of the lid body 4 with a valve 30, a pressure gauge 32, a flow meter (not depicted) or other components such as gas pipes.

In the vaporizable source material container 100 of the present embodiment, the container wall 12 of the container main body 2 is fabricated of copper with 99 to 99.9999% purity, aluminum with 99 to 99.9999% purity or titanium with 99 to 99.9999% purity. A fluorocarbon polymer coating 10 is applied to the container main body 2, the lid body 4 and the joint members 8. To each of them, electrolytic polishing may be applied on their surfaces, instead of the fluorocarbon polymer coating 10. Besides, the fluorocarbon polymer coating 10 may be further applied to the surface of each of the bodies and members having been treated by electrolytic polishing. As a result, the vaporizable source material container 100 has excellent corrosion resistance. Particularly, metal halides generate an acid gas, such as of hydrogen chloride, by reacting with moisture, and accordingly, when a conventional vaporizable source material container is used, such an acid gas may cause corrosion not only inside the vaporizable source material container but also on the surfaces of the container main body, the lid body, the fastening members including the bolt members and nut members, and the joint members. In the vaporizable source material container 100, the fluorocarbon polymer coating 10 and/or electrolytic polishing are applied to each of the container main body 2, the lid body 4, the fastening members 6, and the joint members 8, and particularly even at its portions substantially not being in contact with the metal halide for thin film deposition S, which results in extremely excellent corrosion resistance.

Because the container wall 12 of the container main body 2 is fabricated of copper with 99 to 99.9999% purity, aluminum with 99 to 99.9999% purity or titanium with 99 to 99.9999% purity, as described above, excellent thermal conductivity is achieved and the inside of the container wall 12 can be effectively heated. By making the carrier gas G1 contact with the outer wall of the container wall 12 before being introduced into the container main body 2, the carrier gas G1 introduced into the container main body 2 can be effectively heated, which promotes the vaporization of the metal halide for thin film deposition S. Here, the term "purity" means a proportion (weight ratio) of the principal component in a sample determined by quantitative analysis. It is unfavorable that the purity of copper, aluminum or titanium constituting the container wall 12 is lower than 99%, in that the thermal conductivity of the container wall 12 is decreased. It is also unfavorable that the purity of copper, aluminum or titanium constituting the container wall 12 exceeds 99.9999%, in that the strength of the container wall 12 is decreased.

In concept, the "container wall 12" includes not only the side wall but also the bottom wall. That is, it is preferable that any wall portion with which a vaporizable source material is in contact, when charged in the vaporizable source material container 100, is referred to as the container wall.

A material constituting the fluorocarbon polymer coating 10 is not limited particularly, but may be any coatable fluorocarbon polymer and, for example, may be a polymer in which at least some of its hydrogen atoms are substituted by fluorine atoms, or the like, specifically polytetrafluoroethylene (product name "Teflon" (registered trademark)) or the like. Using such a material is effective in preventing impurities from being incorporated further into the vaporizable source material.

While the thickness of the fluorocarbon polymer coating 10 is not particularly limited, it is preferably set at, for example, 150 to 500 µm, more preferably 200 to 400 µm, and particularly preferably 250 to 350 µm. Most preferably, it is set at about 300 µm. When the thickness of the fluorocarbon polymer coating 10 is smaller than the above-mentioned lower limit value, it is likely that sufficient corrosion resistance cannot be achieved. When the thickness exceeds the above-mentioned upper limit value, it is likely that the coating is too thick.

The fluorocarbon polymer coating 10 may be formed by, for example, vapor deposition, where a vapor deposition method employed there is not limited to any specific ones, but may be any conventionally known one.

The fluorocarbon polymer coating 10 is preferably applied to every part of the inner and outer surfaces of the container main body 2, the inner and outer surfaces of the lid body 4, surfaces of the fastening members 6 and surfaces of the joint members 8. That is, the fluorocarbon polymer coating 10 is preferably applied, not only to surfaces to be in contact with the carrier gas G1, the vaporized metal halide for thin film deposition G2 and the mixed gas G3, but to the entire area of each of the bodies and members, including their surfaces (outer surfaces) that are generally considered not to be in contact with the above-mentioned gases.

The electrolytic polishing applied to the container body 2 and the like is preferably, for example, a polishing treatment performed under a condition (i) described below. When such a polishing treatment is applied, in a case of further applying the fluorocarbon polymer coating 10, adhesion of the fluorocarbon polymer coating 10 is further improved.

Condition (i):

Using an electrode with a diameter of 250 to 350 mm, the current density is set at 28.5 mA/cm$^2$ or lower, the concentration of electrolytic solution at 15 to 30 wt %, the solution flow rate at 1 to 8 L/min, and the pH of the electrolytic solution at an alkaline value. Further, as polishing conditions, the pressure is set at 20 to 60 kPa, the rotation speed at 350 rpm or lower, and inorganic grains with grain sizes from 0.020 to 0.10 µm are used as abrasive grains.

In the condition (i) described above, the current density is preferably set at 15 to 20 mA/cm$^2$. The pH of the electrolytic solution is preferably set at 11 to 11.5.

The rotation speed in the polishing conditions may be set at 50 to 350 rpm. As the abrasive grains, inorganic grains are used, where the inorganic grains are particularly not limited and examples thereof include colloidal silica (colloidal SiO$_2$) and the like.

For example, the inner surface of the container wall 12 processed by such polishing treatment may come to have a surface roughness of Ra=0.8 to 1.1 µm.

Whether or not such electrolytic polishing has been performed on a surface may be confirmed by microscopic observation of the surface using both an electron microscope and an atomic force microscope (AFM), for instance. An example of another method is to inspect the surface state by secondary electron mass spectroscopy.

While, in the vaporizable source material container 100, the fluorocarbon polymer coating 10 and/or the electrolytic polishing are applied to each of the container main body 2, the lid body 4, the fastening members 6 and the joint members 8, the electrolytic polishing may be replaced by chemical polishing. Also with such a configuration, excellent corrosion resistance can be given as well. When the fluorocarbon polymer coating 10 is further applied after the chemical polishing, adhesion of the fluorocarbon polymer coating 10 is further improved as in the case where the electrolytic polishing is applied. As a result, contamination of moisture, oxygen or the like is reduced at the interface with the fluorocarbon polymer coating 10 for example, which leads to the improvement of adhesion of the fluorocarbon polymer coating 10.

Materials of the lid body 4 and the fastening members 6 are not particularly limited, and examples thereof may include aluminum, copper, titanium, nickel alloy, aluminum alloy, super stainless steel, and stainless steel. Among them, examples of nickel alloy may include Hastelloy, Inconel and the like, where "Hastelloy" and "Inconel" are each an alloy containing Ni and Mo. When aluminum, copper or titanium is used, it preferably has a purity of 99% or higher, and more preferably a purity of 99 to 99.9999%.

The composition of "Hastelloy" may be appropriately determined, and specifically is 40 to 60 wt % Ni with 30 to 50 wt % Mo.

The composition of "Inconel" may be appropriately determined, and specifically is 20 to 50 wt % Ni with 70 to 50 wt % Mo.

"Super stainless steel" is a stainless steel containing 17.00 to 19.50 wt % Ni, 19.00 to 21.00 wt % Cr, 5.50 to 6.50 wt % Mo, 0.16 to 0.24 wt % N and 0.50 to 1.00 wt % Cu, having a C content of 0.020 wt % or lower, a Si content of 0.80 wt % or lower, a Mn content of 1.00 wt % or lower, a P content of 0.030 wt % or lower and a S content of 0.015 wt % or lower, and thus being given a further improved corrosion resistance.

The container wall 12 preferably has a double-wall structure 14 composed of an inner wall member 12a and an outer wall member 12b. Accordingly, the carrier gas G1 introduced from the carrier gas inlet 16 is preferably introduced into the container main body 2 after passing through a space between the inner and outer wall members 12a and 12b of the double-wall structure 14. This constitution makes it possible to heat the carrier gas G1 introduced into the container main body 2 at the same time, when the container main body 2 is heated from the outside. Accordingly, the heated carrier gas G1 in contact with the metal halide for thin film deposition S charged in the container main body 2 enables the metal halide for thin film deposition S to be vaporized stably at a high flow rate.

As shown in FIGS. 1 and 2, the vaporizable source material container 100 has an internal inlet 20 to introduce the carrier gas G1 passed through a space between the inner and outer wall members 12a and 12b into the container main body 2 at a bottom surface portion of the inner wall member 12a constituting the container wall 12.

A reference sign 30 in FIGS. 1 and 2 denotes valves 30 for opening and closing flow channels of the vaporizable source material container 100. By opening respective ones of the valves 30, the carrier gas G1 can be introduced into the vaporizable source material container 100 (into the container main body 2), and the mixed gas G3 with the carrier gas G1 can be led to the outside of the container main body 2. In this way, the vaporizable source material container 100 may include two or more on-off valves. A reference sign 32 in FIG. 1 denotes a pressure gauge, and a reference sign 34 in FIG. 2 denotes gas pipes.

Figure 3:
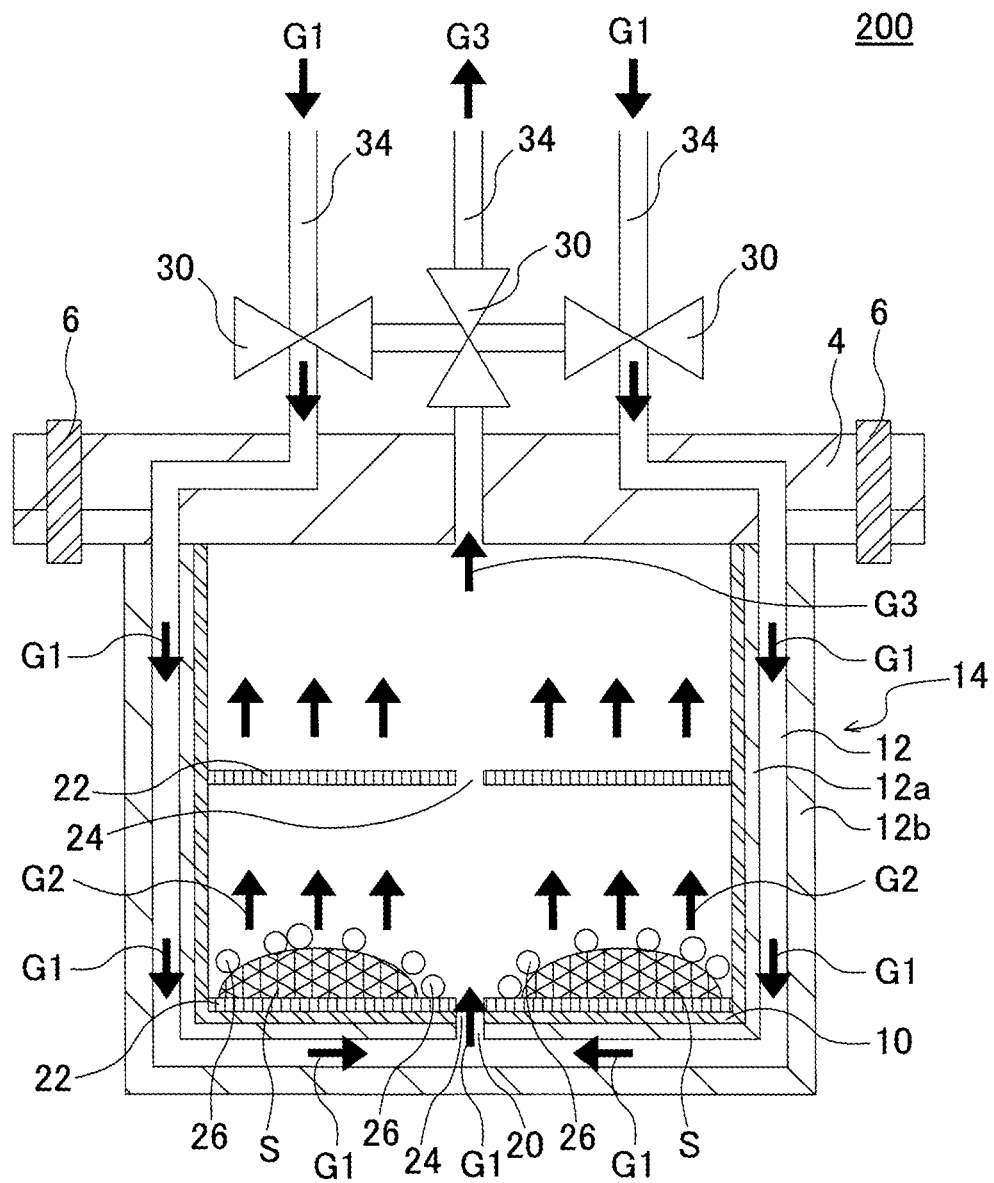
FIG. 3 is a cross-sectional diagram schematically showing another embodiment of a vaporizable source material container according to the present invention.

As shown in FIG. 3, a vaporizable source material container 200 may include one or more members made of aluminum or copper whose maximum length is 1 to 30 mm in one direction inside its container main body 2. The vaporizable source material container 200 shown in FIG. 3 is illustrated to have a configuration further including one or more spherical members 26 that are made of aluminum and have a diameter of 2 to 30 mm. Here, such members to be included in the container main body 2 (for example, the spherical members 26 in FIG. 3) are preferably those having a spherical, spheroidal, leaf-like, spiral shape or another irregular shape. When the members are leaf-shaped ones, their width is preferably about 1 to 2 cm. When they are spheroidal or spiral members, their length in the longer direction (in other words, the longitudinal direction) is preferably about 1.5 to 3 cm. Also, when they are members having another irregular shape, their length in the longer direction is preferably about 1.5 to 3 cm. These members are made of aluminum, copper, or titanium and the same material as that of the container wall 12 may be used. For example, when the container wall 12 is made of copper with a purity of 99 to 99.9999%, the spherical members 26 are preferably made of copper. FIG. 3 is a cross-sectional diagram schematically showing another example of a vaporizable source material container. In FIG. 3, to similar components to those of the vaporized material container 100 shown in FIGS. 1 and 2, identical reference signs are assigned and their descriptions may be omitted.

Having the spherical members 26 made of aluminum shown in FIG. 3, for example, leads to an advantage that thermal conductivity of the compounds in the container main body 2 can be raised. The number of members to be arranged in the container main body 2, such as the spherical members 26 shown in FIG. 3, is not limited particularly, and is preferably 10 to 20, for example.

The vaporizable source material container 100 shown in FIGS. 1 and 2 may be further equipped with at least one plate-shaped shelf member 22 suspended in the container main body 2. The metal halide for thin film deposition S may be placed on the shelf member 22. One or more through holes 24 are formed on the shelf member 22 to allow the carrier gas G1, the vaporized metal halide for thin film deposition G2 and the mixed gas G3 to flow in the container main body 2.

The shelf member 22 may be fabricated of a porous material, for example. In the shelf member 22 fabricated of a porous material, one or more through holes 24 shown in FIGS. 1 and 2 are not necessary to be formed. The porous material constituting the shelf member 22 allows the carrier gas G1, the vaporized metal halide for thin film deposition G2 and the mixed gas G3 to flow, in the container main body 2. Further, when the shelf member 22 is fabricated of a porous material, the shelf member 22 itself has a function as a filter and can collect and remove particles generated in the container main body 2. The porous material constituting the shelf member 22 may include ceramics.

Figure 4:
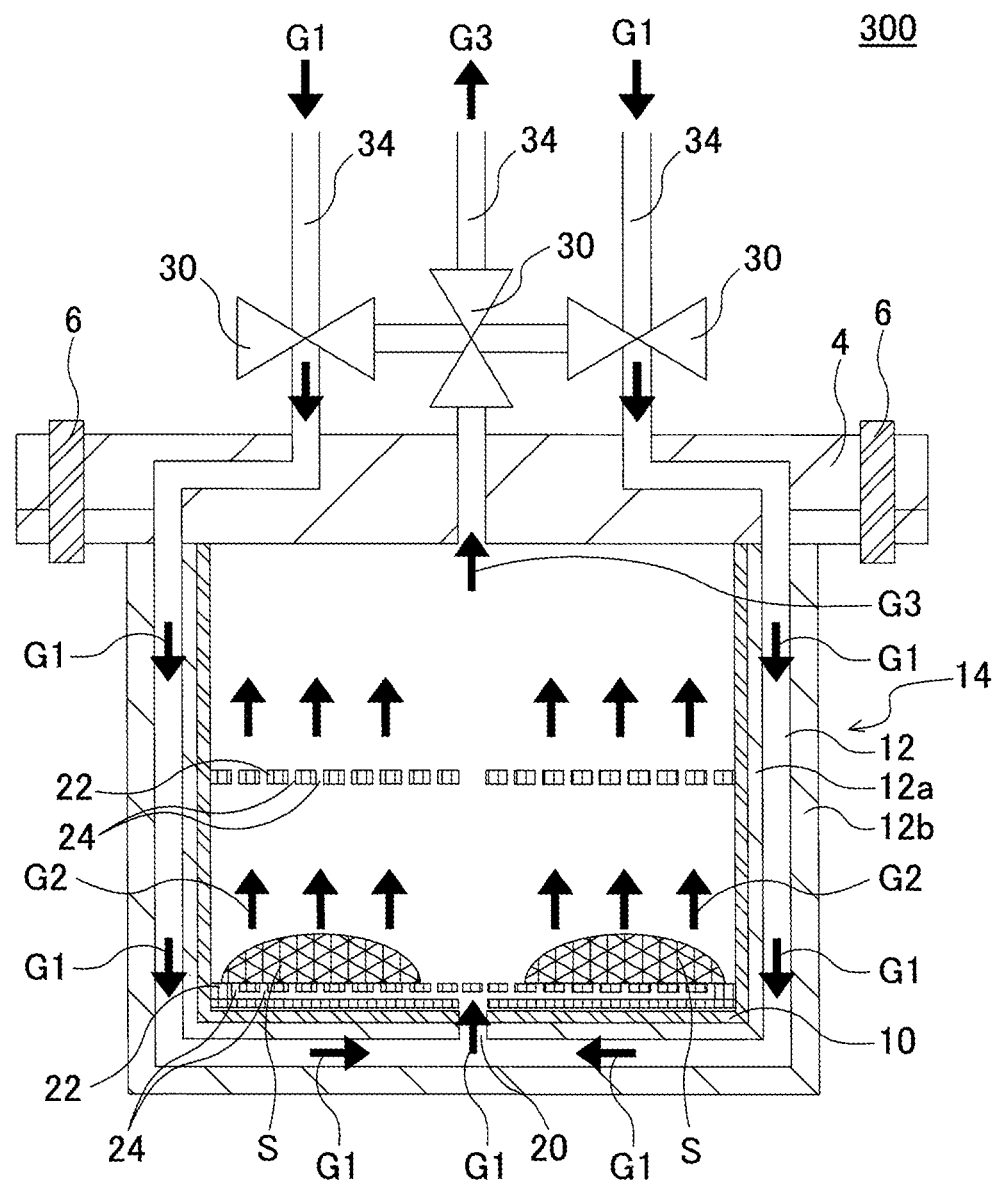
FIG. 4 is a cross-sectional diagram schematically showing still another embodiment of a vaporizable source material container according to the present invention.

As shown in a vaporizable source material container 300 of FIG. 4, it is preferable that at least one of the plate-shaped shelf members 22 suspended from the container main body 2 is equipped with a shower head structure in which a plurality of through holes 24 are formed. The shower head structure refers to a structure in which a plurality of through holes 24 formed in the shelf member 22 serve as ejection holes of the carrier gas G1 and the like, thereby realizing shower-like flow of the gases. For example, gas flow channels through which the carrier gas G1 and the like flow are formed into a grid pattern inside the shelf member 22, and a plurality of through holes 24 are formed on the top surface of the shelf member 22. Here, FIG. 4 is a cross-sectional diagram schematically showing still another example of a vaporizable source material container. In FIG. 4, identical reference signs are assigned to similar components to those of the vaporizable source material container 100 shown in FIGS. 1 and 2, and descriptions thereof may be omitted.

Figure 5:
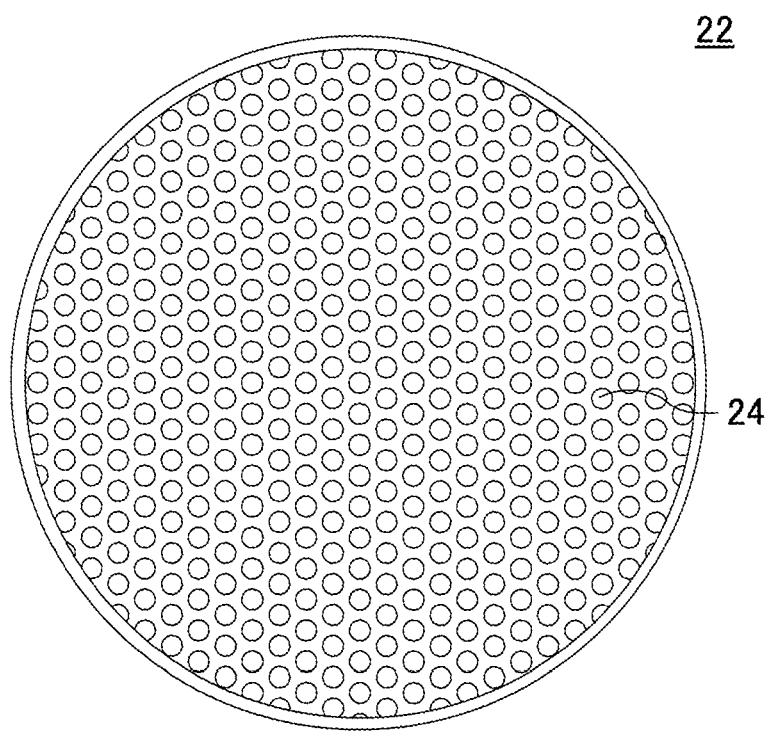
FIG. 5 is a top view schematically showing a shelf member depicted in FIG. 4

There is no specific restriction on arrangement of the plurality of through holes 24 formed in the shelf member 22, and for example, as in a shelf member 22 shown in FIG. 5, the through holes 24 may be formed uniformly on the surface of the shelf member 22. While it is not depicted in any diagrams, an alternative arrangement of the plurality of through holes 24 formed in the shelf member may be such that the plurality of through holes are formed in a manner to sequentially circle within the shelf member and accordingly arranged to draw a spiral locus. FIG. 5 is a top view schematically showing the shelf member depicted in FIG. 4.

The carrier gas G1 is not particularly limited, and examples thereof include hydrogen, helium, nitrogen, oxygen, argon, carbon monoxide, and carbon dioxide.

The metal halide for thin film deposition S to be used as a vaporizable source material is preferably a compound represented by a general formula (2) described below.

$$MX_n \qquad \text{General formula (2):}$$

(Here, in the general formula (2), M represents any element among Al, Hf, Zr, Ta, W, Ga, La, Ce, Pr, Nd, Sm, Eu, Gd, Tb, Dy, Er, Tm, Yb and Co. X represents a halogen atom. n is the number of X atoms.)

When the halogen atom X is chlorine (Cl), examples of the compound represented by the general formula (2) described above may include: aluminum chloride ($AlCl_3$), hafnium chloride ($HfCl_4$), zirconium chloride ($ZrCl_4$), tantalum chloride ($TaCl_5$), tungsten pentachloride ($WCl_5$), tungsten hexachloride ($WCl_6$), gallium chloride ($GaCl_3$), lanthanum chloride ($LaCl_3$), cerium chloride ($CeCl_3$), praseodymium chloride ($PrCl_3$), neodymium chloride ($NdCl_3$), samarium chloride ($SmCl_3$), europium chloride ($EuCl_3$), gadolinium chloride ($GdCl_3$), terbium chloride ($TbCl_3$), dysprosium chloride ($DyCl_3$), erbium chloride ($ErCl_3$), thulium chloride ($TmCl_3$), ytterbium chloride ($YbCl_3$) and cobalt chloride ($CoCl_2$).

The vaporizable source material container of the present embodiment can favorably store even a highly corrosive vaporizable source material such as the above-mentioned compounds represented by the general formula (2), and accordingly the proportion of impurities which exists in the vaporizable source material becomes very small.

The vaporizable source material container 100 of the present embodiment is a container that is in contact with a heating medium or a cooling medium capable of heating or cooling from the outside, and accordingly can keep a compound within the container in either a gas state or a solid state.

The vaporizable source material container of each of the present embodiments may be used as a container for storing a vaporizable source material used for thin film deposition by a chemical vapor deposition (CVD) method, a metalorganic chemical vapor deposition (MOCVD) method and an atomic layer deposition (ALD) method, and preferably is used as a container for thin film deposition by an atomic layer deposition (ALD) method. Specifically, an atomic layer deposition (ALD) method enables formation of a thinner film than that formed by a chemical vapor deposition (CVD) method, and more specifically, a very thin film of about a few-nm thickness can be formed by the ALD method, while accuracy of the film is easily affected by impurities contained in the vaporizable source material. In this respect, by using the vaporizable source material container of each of the present embodiments, impurities contained in the vaporizable source material can be reduced to an extremely small amount.

The vaporizable source material container of each of the present embodiments may further include a valve arranged at a portion of the gas flow path located more downstream than the mixed gas outlet. The valve is preferably a valve having a CV value (in terms of water) of 0.2 or more. In particular, the valve is more preferably a vacuum valve represented by a bellows valve. By including such a valve, supply of the mixed gas can be performed more effectively. When the CV value (in terms of water) is less than 0.2, the flow of a great amount of the mixed gas may be hindered, and the mixed gas may stay in the valve. When the mixed gas stays in the valve, a temperature may decrease due to the heat of vaporization, the vaporizable source material (metal halide for thin film deposition) may accordingly stick in the valve, and the valve may be thereby blocked. By providing a valve with a CV value (in terms of water) of 0.2 or more, such blockage of the valve can be effectively prevented, and the mixed gas can be supplied without any trouble. The CV value of the valve is preferably 0.2 or more, more preferably 0.6 or more, and particularly preferably 1.0 or more. While there is no specific upper limit on the CV value, 3.0 or 2.5 may be given as an example of the upper limit value. Examples of a valve having the above-described CV value may include a diaphragm, a ball valve, a bellows valve, and the like. These valves are preferably independent of the valve function, body material, seat material, and temperature.

The valve CV value described above is a value in terms of water that is measured by fully opening the valve and allowing water to flow through the valve. Specifically, a flow rate of a fluid (water) flowing through the valve is measured on both the inflow side and the outflow side of the valve. For example, a flow rate Q of the fluid flowing through the valve is measured using a flow meter. Next, pressure gauges are placed in the front and the rear of the valve, and a pressure loss ΔP of the fluid during its passing through the valve is measured. It is assumed that the flow rate Q and the pressure loss ΔP of the fluid in passing through the valve are measured in accordance with actual usage conditions. For example, the measurement is performed in a manner to make the values close to those of the actual usage conditions. For example, the flow rate Q of water can be determined from the specific gravity of the mixed gas and the specific gravity of water. For example, assuming that the specific gravity of water is 1, the specific gravity of each vaporizable source material is its own value (for example, 1.40 to 1.68) and the flow rate of a carrier gas is 500 cc/min, the flow rate Q of water is calculated to be 300 cc/min. The CV value is measured under a condition of 15° C.

[2] Fabrication Method of Vaporizable Source Material Container:

For example, the vaporizable source material container according to the present invention may be fabricated as follows. First, the outer wall member of the container wall constituting the container main body is produced by hollowing out a material or welding a roll-shaped work piece, using a conventionally known method. Subsequently, the inner wall member of the container wall constituting the container main body is made of copper, aluminum or titanium having a purity of 99 to 99.9999%, respectively. Then, the inner wall member is installed inside the outer wall member to construct the container main body. Further, the lid body configured to be detachably attached to the container main body is produced. Further, the bolt insertion holes for installing the fastening members are formed in both the container main body and the lid body, and the bolt and nut members are prepared as the fastening members compatible with the bolt insertion holes. In addition, various joint members to be arranged at the carrier gas inlet and the mixed gas outlet of the lid body are prepared. In this way, the bodies and members not having been subjected to treatment, which are to constitute the vaporizable source material container, are obtained (preparation step).

Next, the bodies and members prepared as necessary are subjected to polishing treatment (polishing treatment step). Specifically, the inner surface of the bodies and members is polished each to obtain polished bodies and members. In the polishing treatment step, it is preferable to employ electrolytic polishing under the condition (i) already described above.

Next, a fluorocarbon polymer coating is applied to each of the bodies and members (fluorocarbon polymer coating step). In this step, the fluorocarbon polymer coating may be formed by vapor deposition, as already described above. When the electrolytic polishing treatment under the condition (i) has been performed in the above-described polishing treatment step, the fluorocarbon polymer coating does not need to be applied.

Next, the bodies and members are assembled into the vaporizable source material container (assembly step). The vaporizable source material container according to the present invention can be fabricated through the above-described steps. Here, a method of fabricating the vaporizable source material container according to the present invention is not limited to the above-described one.

[3] Usage of Vaporizable Source Material Container:

First, the carrier gas inlet 16 of the vaporizable source material container 100 shown in FIGS. 1 and 2 is coupled with a carrier gas tank (not depicted), and further, the mixed gas outlet 18 is coupled with a semiconductor processing instrument (not depicted). Next, a metal halide for thin film deposition S is charged into the vaporizable source material container 100, as a vaporizable source material, and subsequently the container main body 2 is made airtight.

Next, the carrier gas G1 is introduced from the carrier gas tank into the vaporizable source material container 100. Then, the vaporizable source material having been vaporized in the vaporizable source material container 100 (vaporized metal halide for thin film deposition G2) is mixed with the carrier gas G1, and the resulting mixed gas G3 is led out from the mixed gas outlet 18. Here, the vaporizable source material is vaporized (evaporated) by heating etc., to be a source gas. Subsequently, in the semiconductor processing instrument, thin film deposition is performed by a chemical vapor deposition (CVD) method, a metalorganic chemical vapor deposition (MOCVD) method or an atomic layer deposition (ALD) method. The semiconductor processing instrument is where a substrate to be coated is set (for example, a reaction chamber of a CVD apparatus) and a desired thin film is deposited on the substrate set in the semiconductor processing instrument.

The vaporizable source material container 100 has excellent corrosion resistance, enables the rate of impurities originating from the container in the vaporizable source material to reduce to a very small value, and thereby enables a high-purity mixed gas to supply to a semiconductor processing instrument. The vaporizable source material container according to the present invention is a container used for vaporization in CVD, ALD, MOCVD and the like, where the container is used as a pressure vessel provided with a valve for semiconductor use.

[4] Solid Vaporization/Supply System:

Next, an embodiment of a solid vaporization/supply system according to the present invention will be described. A solid vaporization/supply system of the present embodiment is a solid vaporization/supply system using the vaporizable source material container according to the present invention described above. That is, it includes the vaporizable source material container 100 and the metal halide for thin film deposition S stored in the vaporizable source material container 100, both already shown in FIGS. 1 and 2. The solid vaporization/supply system of the present embodiment may further include a carrier gas supply means (not depicted) for supplying the carrier gas G1 into the container main body 2. The solid vaporization/supply system of the present embodiment may further include a buffer tank (not depicted) for storing the mixed gas G3 on the downstream side of the mixed gas outlet 18 of the vaporizable source material container 100. The buffer tank (not depicted) is an optional component, and does not necessarily need to be included. When the buffer tank is not included, for example, the mixed gas G3 generated in the vaporizable source material container 100 is directly supplied to a semiconductor processing instrument or the like.

In the solid vaporization/supply system of the present embodiment, the carrier gas G1 is supplied from the carrier gas inlet 16 of the lid body 4 constituting the vaporizable source material container 100, and the mixed gas G3 generated by mixing the vaporized metal halide for thin film deposition G2 with the carrier gas G1 is supplied from the mixed gas outlet 18 of the lid body 4. The solid vaporization/supply system of the present embodiment has an effect of supplying a vaporizable source material in a higher purity state and at a high flow rate.

The solid vaporization/supply system of the present embodiment is preferably configured as follows. First, the metal halide for thin film deposition S is charged into the vaporizable source material container 100. Next, the metal halide for thin film deposition S is heated by heating the container wall 12 of the container main body 2 and, at the same time, the carrier gas G1 is introduced from the carrier gas inlet 16 of the lid body 4 and made to pass through a space between the inner and outer wall members 12a and 12b of the double-wall structure 14 of the container wall 12, so that thus heated carrier gas G1 is led into the container main body 2. Then, the vaporized metal halide for thin film deposition G2 and the carrier gas G1 are mixed to generate the mixed gas G3. This configuration enables the heated carrier gas G1 to get in contact with the heated carrier gas G1, and thereby enables the metal halide for thin film deposition S to vaporize stably at a high flow rate.

The solid vaporization/supply system of the present embodiment may further include a valve arranged at a portion of a gas flow path located more downstream than the mixed gas outlet. Preferably, the valve has a CV value (in terms of water) of 0.2 or more during the flowing of the mixed gas. More preferably in particular, the valve is a vacuum valve represented by a bellows valve. Such a valve allows the mixed gas to be supplied more effectively.

The CV value can be adjusted according to the method described above. It is assumed that the flow rate Q and the pressure loss $\Delta P$ in passing through the valve, both used for calculating the CV value, are measured in accordance with actual usage conditions during the flowing of the mixed gas.

EXAMPLES

Hereinafter, the present invention will be described in more detail with reference to examples and comparative examples, but the present invention is not limited thereto.

Examples 1 to 15 and Comparative Examples 1 to 16

As shown in FIG. 1, vaporizable source material containers 100, each including the container main body 2, the lid body 4, the fastening members 6, and the joint members 8, were fabricated. In the present examples and comparative examples, container walls of the container main bodies of the vaporizable source material containers were made of, respectively, materials described in a column entitled as "container wall" consisting of "material" and "purity (%)" in Tables 1 and 2. Further, the surfaces of the container body, the lid body, the fastening members, and the joint members were subjected to polishing treatment under a polishing condition (i) described below. Subsequently, a fluorocarbon polymer coating was applied to the polished surface of each of the bodies and members. The fluorocarbon polymer coating was performed by vapor depositing polytetrafluoroethylene (Teflon) using an apparatus of an electron-beam vacuum evaporation method.

Polishing Condition (i):

Using an electrode with a diameter of 300 mm, the current density was set at 20 mA/cm² or less, the concentration of electrolytic solution at 20 wt %, the solution flow rate at 3 L/min, and the pH of the electrolytic solution at 10. Further, as polishing conditions, the pressure was set at 31.35 kPa, the rotation speed at 300 rpm, and colloidal silica with a grain size of 0.07 μm was used as the abrasive grains.

In the vaporizable source material container of each of the examples and comparative examples, a valve having a CV value (in terms of water) of 1.5 was arranged on the downstream side of the mixed gas outlet of the vaporizable source material container, and the mixed gas was supplied through the valve.

Examples 16 to 30

In Examples 16 to 30, vaporizable source material containers were fabricated similarly to those in Examples 1 to 15 except that the fluorocarbon polymer coating was not applied. That is, in the vaporizable source material container of Examples 16 to 30, only the polishing treatment under the above-described polishing condition (i) was performed on surfaces of the container main body, the lid body, the fastening members, and the joint members. In Examples 16 to 30, container walls of the container main bodies of the vaporizable source material containers were made of the materials described in a column entitled as "container wall" consisting of "material" and "purity (%)" in Table 3.

The metal halides for thin film deposition described in a column entitled as "source material (metal halide)" in Tables 1 to 3 were stored in each of the vaporizable source material containers of Examples 1 to 30 and Comparative Examples 1 to 16, where a carrier gas was supplied into the container main body, a mixed gas in which the vaporized metal halide for thin film deposition and generated a mixed gas of the vaporized metal halide for thin film deposition with the carrier gas. The mixed gas thus generated was used for thin film deposition by an atomic layer deposition (ALD) method. Compositions of ALD films thus deposited by the atomic layer deposition (ALD) method are described in Tables 4 to 6. Further, the amounts of impurities (12 elements described in Tables 4 to 6) contained in each of the vaporizable source materials after the thin film deposition were measured by an ICPMS (inductively coupled plasma mass spectrometer). In a row entitled as "before thin film deposition" in Table 4, the amounts of impurities (12 elements shown in Tables 4 to 6) contained in the vaporizable source materials before the thin film deposition are described.

The amount of impurities was measured in a way described below. First, after the film deposition, residues of the vaporizable source material left in the container main body of the vaporizable source material container were collected. Next, in an apparatus of ICPMS (inductively coupled high frequency plasma mass spectrometry), a predetermined amount of the collected substance was dissolved in aqua regia. Subsequently, the solution was heated to 120° C. on a hot plate, thereby being evaporated to dryness. Then, the substance having been dried by evaporation was diluted to obtain a measurement sample. Then, metal impurities in the measurement sample were measured with the analysis apparatus described above.

Before and after the thin film deposition, the surface roughness of the inner surface of the container main body 2 was measured by an AFM analyzer (atomic force microscope) (manufactured by HORIBA). The surface roughness was measured several times to calculate their average value. The surface roughness values after and before thin film deposition were represented by A and B, respectively. A value (A/B) corresponding to a result of dividing A by B was calculated. The calculated "A/B" values are described in a column entitled as "inner surface roughness" in Tables 4 to 6.

A growth rate (GPC: Growth Per Cycle) was measured in the thin film deposition by the atomic layer deposition (ALD) method. Specifically, in depositing the thin film described above, the valve was opened and closed once every 0.2 seconds to introduce the mixed gas containing the vaporizable source material into the deposition chamber. Assuming that 0.2 seconds is the time for a valve to take for one opening/closing as one cycle, and by measuring the thickness of a film deposited on an 8-inch silicon wafer, a growth rate of the film per unit time (1 cycle) was calculated.

TABLE 1

| | container wall | | | fluoro- | source material |
| --- | --- | --- | --- | --- | --- |
| | material | purity (%) | electrolytic polishing | polymer coating | (metal halide) |
| Example 1 | Al | 99.999 | applied | applied | AlCl₃ |
| Example 2 | Ti | 99.9999 | applied | applied | HfCl₄ |
| Example 3 | Al | 99.999 | applied | applied | ZrCl₄ |
| Example 4 | Ti | 99.999 | applied | applied | WCl₅ |
| Example 5 | Ti | 99.9999 | applied | applied | WCl₆ |
| Example 6 | Al | 99.9999 | applied | applied | LaCl₃ |
| Example 7 | Al | 99.999 | applied | applied | CoCl₂ |
| Example 8 | Al | 99.999 | applied | applied | WF₅ |
| Example 9 | Ti | 99.999 | applied | applied | HfI₄ |
| Example 10 | Ti | 99.9999 | applied | applied | ZrI₄ |
| Example 11 | Al | 99.9999 | applied | applied | LaI₃ |
| Example 12 | Al | 99.999 | applied | applied | LaF₃ |
| Example 13 | Al | 99 | applied | applied | AlCl₃ |
| Example 14 | Cu | 99.999 | applied | applied | AlCl₃ |
| Example 15 | Cu | 99.999 | applied | applied | ZrCl₄ |

$AlCl_3$, $HfCl_4$, $ZrCl_4$, $WCl_5$, $WCl_6$, $LaCl_3$, $CoCl_2$, $WF_5$, $HfI_4$, $ZrI_4$, $LaI_3$, $LaF_3$.

TABLE 2

| | container wall | | | Fluorocarbon polymer coating | source material (metal halide) |
|---|---|---|---|---|---|
| | material | purity (%) | electrolytic polishing | | |
| Comp. Ex. 1 | SUS316L | — | applied | not applied | AlCl$_3$ |
| Comp. Ex. 2 | SUS316L | — | applied | not applied | HfCl$_4$ |
| Comp. Ex. 3 | SUS316L | — | applied | not applied | ZrCl$_4$ |
| Comp. Ex. 4 | SUS316L | — | applied | not applied | WCl$_5$ |
| Comp. Ex. 5 | SUS316L | — | applied | not applied | WCl$_6$ |
| Comp. Ex. 6 | SUS316L | — | applied | not applied | LaCl$_3$ |
| Comp. Ex. 7 | SUS316L | — | applied | not applied | CoCl$_2$ |
| Comp. Ex. 8 | SUS316L | — | applied | not applied | WF$_6$ |
| Comp. Ex. 9 | SUS316L | — | applied | not applied | HfI$_4$ |
| Comp. Ex. 10 | SUS316L | — | applied | not applied | ZrI$_4$ |
| Comp. Ex. 11 | SUS316L | — | applied | not applied | LaI$_3$ |
| Comp. Ex. 12 | SUS316L | — | applied | not applied | LaF$_3$ |
| Comp. Ex. 13 | Al | 98 | applied | applied | WF$_6$ |
| Comp. Ex. 14 | Ti | 98 | applied | applied | AlCl$_3$ |
| Comp. Ex. 15 | Al | 99.999 | not applied | not applied | WF$_6$ |
| Comp. Ex. 16 | Ti | 99.999 | not applied | not applied | AlCl$_3$ |

TABLE 3

| | container wall | | | fluoropolymer coating | source material (metal halide) |
|---|---|---|---|---|---|
| | material | purity (%) | electrolytic polishing | | |
| Example 16 | Al | 99.999 | applied | not applied | AlCl$_3$ |
| Example 17 | Ti | 99.9999 | applied | not applied | HfCl$_4$ |
| Example 18 | Al | 99.999 | applied | not applied | ZrCl$_4$ |
| Example 19 | Ti | 99.999 | applied | not applied | WCl$_5$ |
| Example 20 | Ti | 99.9999 | applied | not applied | WCl$_6$ |
| Example 21 | Al | 99.9999 | applied | not applied | LaCl$_3$ |
| Example 22 | Al | 99.999 | applied | not applied | CoCl$_2$ |
| Example 23 | Al | 99.999 | applied | not applied | WF$_5$ |
| Example 24 | Ti | 99.999 | applied | not applied | HfI$_4$ |
| Example 25 | Ti | 99.9999 | applied | not applied | ZrI$_4$ |
| Example 26 | Al | 99.9999 | applied | not applied | LaI$_3$ |
| Example 27 | Al | 99.999 | applied | not applied | LaF$_3$ |
| Example 28 | Al | 99 | applied | applied | AlCl$_3$ |
| Example 29 | Cu | 99.999 | applied | not applied | AlCl$_3$ |
| Example 30 | Cu | 99.999 | applied | not applied | ZrCl$_4$ |

TABLE 4

| | ALD film | impurity content in residues after thin film deposition (ppb) | | | | | | | | | | | | growth rate GPC (nm) | inner surface roughness A/B |
|---|---|---|---|---|---|---|---|---|---|---|---|---|---|---|---|
| | | Na | K | Ca | Fe | Ni | Cu | Cr | Mo | Mn | Ti | V | Y | | |
| Example 1 | Al$_2$O$_3$ | 0.1 | 0.5 | 0.4 | 2 | 0.1 | 0.8 | 0.2 | 0.5 | 2 | 1.2 | 1.6 | 0.2 | 1.2 | 1 |
| Example 2 | HfO$_2$ | 0.2 | 0.1 | 0.8 | 5 | 0.3 | 0.8 | 0.5 | 0.5 | 1 | 1.2 | 1.6 | 0.2 | 1.5 | 1.1 |
| Example 3 | ZrO$_2$ | 0.1 | 0.5 | 0.4 | 2 | 0.5 | 0.8 | 0.2 | 0.8 | 1 | 1.2 | 2 | 0.3 | 1 | 1 |
| Example 4 | WN | 0.1 | 0.5 | 0.5 | 2 | 0.1 | 0.5 | 0.8 | 0.5 | 2 | 1.2 | 1.6 | 0.2 | 2.1 | 0.9 |
| Example 5 | WO$_3$ | 0.5 | 0.6 | 0.4 | 3 | 0.1 | 0.8 | 0.2 | 0.5 | 3 | 1.2 | 3 | 0.3 | 3.1 | 0.9 |
| Example 6 | La$_2$O$_3$ | 0.4 | 0.8 | 0.5 | 2 | 0.8 | 0.5 | 0.7 | 0.7 | 1 | 1.2 | 1.6 | 0.2 | 1.5 | 1.1 |
| Example 7 | CoN | 0.2 | 0.5 | 0.4 | 4 | 0.1 | 0.2 | 0.2 | 0.5 | 1 | 1.2 | 2 | 0.5 | 1.8 | 1.2 |
| Example 8 | W | 0.1 | 0.7 | 0.6 | 3 | 0.5 | 0.5 | 0.2 | 0.5 | 2 | 1.2 | 1.6 | 0.4 | 2 | 1 |
| Example 9 | HfN | 0.2 | 0.6 | 0.8 | 2 | 0.2 | 0.8 | 0.1 | 0.5 | 3 | 1.2 | 2 | 0.2 | 3 | 1.2 |
| Example 10 | ZrN | 0.1 | 0.5 | 0.4 | 2 | 0.1 | 0.5 | 0.2 | 0.6 | 2 | 1.2 | 1.6 | 0.4 | 8 | 1.2 |
| Example 11 | LaN | 0.7 | 0.5 | 0.8 | 2 | 0.8 | 0.7 | 0.1 | 0.5 | 4 | 1.2 | 2 | 0.5 | 6 | 0.9 |
| Example 12 | La$_2$O$_3$ | 0.1 | 0.5 | 0.4 | 3 | 0.1 | 0.5 | 0.2 | 0.5 | 2 | 1.2 | 1.6 | 0.2 | 2.9 | 0.9 |
| Example 13 | Al$_2$O$_3$ | 0.08 | 0.5 | 0.4 | 2 | 0.5 | 0.8 | 0.2 | 0.8 | 3 | 1.2 | 2 | 0.2 | 0.8 | 0.7 |
| Example 14 | AlN | 0.1 | 0.5 | 0.4 | 2 | 0.1 | 0.5 | 0.2 | 0.6 | 2 | 1.2 | 1.6 | 0.4 | 8 | 1.1 |
| Example 15 | ZrO$_2$ | 0.4 | 0.8 | 0.5 | 2 | 0.8 | 0.5 | 0.7 | 0.7 | 1 | 1.2 | 1.6 | 0.2 | 1.5 | 0.95 |
| before deposition | — | 0.1 | 0.5 | 0.4 | 2 | 0.1 | 0.5 | 0.1 | 0.5 | 1 | 1.2 | 1.5 | 0.1 | — | — |

TABLE 5

| | ALD film | impurity content in residues after thin film deposition (ppb) | | | | | | | | | | | | growth rate GPC (nm) | inner surface roughness A/B |
|---|---|---|---|---|---|---|---|---|---|---|---|---|---|---|---|
| | | Na | K | Ca | Fe | Ni | Cu | Cr | Mo | Mn | Ti | V | Y | | |
| Comp. Ex. 1 | Al$_2$O$_3$ | 3000 | 2500 | 2000 | 1500 | 1000 | 500 | 2500 | 5000 | 2530 | 1560 | 1560 | 1560 | 0.001 | 5.1 |
| Comp. Ex. 2 | HfO$_2$ | 2014 | 2300 | 2586 | 2872 | 3158 | 3444 | 3730 | 4016 | 2530 | 1850 | 1850 | 1850 | 0.005 | 4.3 |
| Comp. Ex. 3 | ZrO$_2$ | 2015 | 2800 | 4800 | 2801 | 2850 | 8520 | 2580 | 3980 | 2530 | 1630 | 1630 | 1800 | 0.002 | 3.5 |
| Comp. Ex. 4 | WN | 3000 | 3000 | 2506 | 2301 | 1580 | 5820 | 1750 | 5820 | 2500 | 1790 | 1790 | 1790 | 0.001 | 2.5 |
| Comp. Ex. 5 | WO$_3$ | 5000 | 6500 | 2360 | 2850 | 2304 | 2900 | 1820 | 2800 | 2400 | 1700 | 1830 | 1700 | 0.014 | 2.6 |
| Comp. Ex. 6 | La$_2$O$_3$ | 2500 | 23500 | 3172 | 3104 | 2487 | 6390 | 1474 | 3544 | 2411 | 1772 | 1876 | 1806 | 0.014 | 3.5 |
| Comp. Ex. 7 | CoN | 2100 | 18547 | 3758 | 3316 | 2590 | 7107 | 1140 | 3285 | 2382 | 1794 | 1924 | 1828 | 0.012 | 2.1 |

TABLE 5-continued

|  | ALD film | impurity content in residues after thin film deposition (ppb) | | | | | | | | | | | | growth rate GPC (nm) | inner surface roughness A/B |
|---|---|---|---|---|---|---|---|---|---|---|---|---|---|---|---|
|  |  | Na | K | Ca | Fe | Ni | Cu | Cr | Mo | Mn | Ti | V | Y | | |
| Comp. Ex. 8 | W | 2700 | 21912 | 6000 | 3529 | 2693 | 7825 | 8020 | 3025 | 2353 | 1816 | 1972 | 1850 | 0.15 | 3.5 |
| Comp. Ex. 9 | HfN | 3500 | 25278 | 2850 | 3742 | 2796 | 8542 | 8020 | 2766 | 2324 | 1838 | 2020 | 1872 | 0.03 | 3.5 |
| Comp. Ex. 10 | ZrN | 2500 | 28644 | 4870 | 3955 | 2899 | 9260 | 138 | 2506 | 2295 | 1860 | 2068 | 1894 | 0.001 | 4.1 |
| Comp. Ex. 11 | LaN | 4200 | 32010 | 4344 | 4168 | 3002 | 9978 | 1960 | 2246 | 2266 | 1882 | 2116 | 1916 | 0.006 | 2.5 |
| Comp. Ex. 12 | La$_2$O$_3$ | 3500 | 35375 | 4930 | 4381 | 3105 | 10695 | 5300 | 1987 | 2237 | 1904 | 2164 | 1938 | 0.023 | 2.8 |
| Comp. Ex. 13 | W | 2100 | 18547 | 3758 | 3316 | 2590 | 7107 | 1140 | 3285 | 2382 | 1794 | 1924 | 1828 | 0.0002 | 4.1 |
| Comp. Ex. 14 | Al$_2$O$_3$ | 21912 | 6000 | 3529 | 2693 | 7825 | 8020 | 3025 | 3758 | 3316 | 2590 | 9260 | 138 | 0.0001 | 3.5 |
| Comp. Ex. 15 | W | 3500 | 25278 | 2850 | 3742 | 2796 | 8542 | 4700 | 2766 | 2324 | 1838 | 2020 | 1872 | 0.002 | 2.4 |
| Comp. Ex. 16 | Al$_2$O$_3$ | 2015 | 2800 | 4800 | 2801 | 2850 | 8520 | 2580 | 3980 | 2530 | 1630 | 1630 | 1800 | 0.003 | 2.4 |

TABLE 6

|  | ALD film | impurity content in residues after thin film deposition (ppb) | | | | | | | | | | | | growth rate GPC (nm) | inner surface roughness A/B |
|---|---|---|---|---|---|---|---|---|---|---|---|---|---|---|---|
|  |  | Na | K | Ca | Fe | Ni | Cu | Cr | Mo | Mn | Ti | V | Y | | |
| Example 16 | Al$_2$O$_3$ | 0.1 | 0.5 | 0.4 | 2 | 0.1 | 0.8 | 0.2 | 0.5 | 2 | 1.2 | 1.6 | 0.2 | 1.1 | 1.5 |
| Example 17 | HfO$_2$ | 0.2 | 0.1 | 0.4 | 5 | 0.3 | 0.8 | 0.5 | 0.5 | 1 | 1.2 | 1.6 | 0.2 | 1.5 | 1 |
| Example 18 | ZrO$_2$ | 0.1 | 0.5 | 0.4 | 2 | 0.5 | 0.8 | 0.2 | 0.8 | 1 | 1.2 | 2 | 0.3 | 1.5 | 1 |
| Example 19 | WN | 0.1 | 0.5 | 0.5 | 2 | 0.1 | 0.5 | 0.8 | 0.5 | 2 | 1.2 | 1.6 | 0.2 | 2.1 | 0.9 |
| Example 20 | WO$_3$ | 0.5 | 0.6 | 0.4 | 3 | 0.1 | 0.8 | 0.2 | 0.5 | 3 | 1.2 | 3 | 0.3 | 2.9 | 1 |
| Example 21 | La$_2$O$_3$ | 0.4 | 0.8 | 0.5 | 2 | 0.8 | 0.5 | 0.7 | 0.7 | 1 | 1.2 | 1.6 | 0.2 | 1.5 | 1.1 |
| Example 22 | CoN | 0.2 | 0.5 | 0.4 | 4 | 0.1 | 0.2 | 0.2 | 0.5 | 1 | 1.2 | 2 | 0.5 | 1.5 | 1.1 |
| Example 23 | W | 0.1 | 0.7 | 0.6 | 3 | 0.5 | 0.5 | 0.2 | 0.5 | 2 | 1.2 | 1.6 | 0.4 | 2 | 1 |
| Example 24 | HfN | 0.2 | 0.6 | 0.8 | 2 | 0.2 | 0.8 | 0.1 | 0.5 | 3 | 1.2 | 2 | 0.2 | 3 | 1.2 |
| Example 25 | ZrN | 0.1 | 0.5 | 0.4 | 2 | 0.1 | 0.5 | 0.2 | 0.6 | 2 | 1.2 | 1.6 | 0.4 | 6 | 1 |
| Example 26 | LaN | 0.7 | 0.5 | 0.8 | 2 | 0.8 | 0.7 | 0.1 | 0.5 | 4 | 1.2 | 2 | 0.5 | 6 | 0.9 |
| Example 27 | La$_2$O$_3$ | 0.1 | 0.5 | 0.4 | 3 | 0.1 | 0.5 | 0.2 | 0.5 | 2 | 1.2 | 1.6 | 0.2 | 4 | 0.9 |
| Example 28 | Al$_2$O$_3$ | 0.5 | 0.8 | 0.1 | 0.5 | 0.2 | 0.6 | 0.4 | 3 | 0.1 | 0.8 | 0.6 | 2 | 1.1 | 0.7 |
| Example 29 | AlN | 0.1 | 0.5 | 0.4 | 2 | 0.1 | 0.5 | 0.2 | 0.6 | 2 | 1.2 | 1.6 | 0.4 | 8 | 0.9 |
| Example 30 | ZrO$_2$ | 0.4 | 0.8 | 0.5 | 2 | 0.8 | 0.5 | 0.7 | 0.7 | 1 | 1.2 | 1.6 | 0.2 | 2.2 | 1.1 |

[Results]

As can be seen from the results of Tables 4 to 6, in the cases using the vaporizable source material containers of Examples 1 to 30, the amounts of impurities are smaller compared with in the case using those of Comparative Examples 1 to 16. In Examples 1 to 30, the vaporizable source material containers have values of "A/B" in the column "inner surface roughness" close to 1, which means that the differences in surface roughness are small between before and after the thin film deposition. The smallness of the differences in surface roughness indicates that the degree of corrosion due to the vaporizable source material was small, and accordingly indicates high corrosion resistance. These results confirm that the vaporizable source material containers of Examples 1 to 30 have excellent corrosion resistance. Also obtained is a result that the vaporizable source material containers of Examples 1 to 30 give a higher growth rate.

INDUSTRIAL APPLICABILITY

The solid vaporization/supply system according to the present invention is applicable to thin film deposition by a chemical vapor deposition (CVD) method, a metalorganic chemical vapor deposition (MOCVD) method and an atomic layer deposition (ALD) method.

REFERENCE SIGNS LIST

2: container main body, 4: lid body, 6: fastening member, 8: joint member, 10: fluorocarbon polymer coating, 12: container wall, 12a: inner wall member, 12b: outer wall member, 14: double-wall structure, 16: carrier gas inlet, 18: mixed gas outlet, 20: internal inlet, 22: shelf member, 24: through hole, 26: spherical member, 30: valve, 32: pressure gauge, 34: gas pipe, 100, 200, 300: vaporizable source material container, G1: carrier gas, G2: vaporized metal halide for thin film deposition (vaporizable source material having been vaporized), G3: mixed gas, S: metal halide for thin film deposition (vaporizable source material).

The invention claimed is:

1. A vaporizable source material container for storing and vaporizing a metal halide for thin film deposition to be used as a vaporizable source material, the vaporizable source material container comprising:
   a container main body including a container wall which has a double-wall structure composed of an inner wall and an outer wall;
   a lid body detachably fixed to the container main body, and provided with a carrier gas inlet for introducing a carrier gas into the container main body and a mixed gas outlet for leading a mixed gas of the vaporized metal halide for thin film deposition with the carrier gas to the outside;
   a bolt and nut for fixing the container main body with the lid body;
   an internal inlet provided at a bottom surface portion of the inner wall constituting the container wall;
   a joint arranged at the carrier gas inlet and the mixed gas outlet of the lid body; and at least one plate-shaped shelf, being fabricated of a porous material, suspended from the container main body, wherein the carrier gas introduced from the carrier gas inlet passes through a space between the inner wall and outer wall of the double-wall structure, enters the container main body only through the internal inlet at he bottom surace portion of the inner wall, and gets in contact with the metal halide for thin film deposition placed on the at least one plate-shaped shelf, and then a mixed gas of the vaporized metal halide for thin film deposition and the carrier gas is led to the outside through the mixed gas outlet, wherein the at least one plate-shaped shelf has a shower head structure provided with a plurality of through holes formed therein, wherein the container wall of the container main body is fabricated of copper with 99 to 99.9999% purity, aluminum with 99 to 99.9999% purity, or titanium with 99 to 99.9999% purity, and wherein the container main body, the lid body, the bolt and nut, and the joint are each treated by fluorocarbon polymer coating and/or by electrolytic polishing on its surface.

2. The vaporizable source material container according to claim 1, further comprising one or more members having a spherical, spheroidal, leaf-like, spiral shape or another irregular shape, made of aluminum or copper and having a maximum length of 1 to 30 mm in one direction in the container main body.

3. The vaporizable source material container according to claim 1, wherein the metal halide for thin film deposition to be used as the vaporizable source material is a compound represented by a general formula (1) described below;

$$MX_n \qquad \text{General formula (1):}$$

in the general formula (1), M represents any element among Al, Hf, Zr, Ta, W, Ga, La, Mg, Ce, Pr, Nd, Sm, Eu, Gd, Tb, Dv, Er, Tm, Yb and Co; X represents a halogen atom; n is the number of X atoms.

4. The vaporizable source material container according to claim 1, to be used for thin film deposition by a chemical vapor deposition method.

5. The vaporizable source material container according to claim 1, to be used for thin film deposition by an atomic layer deposition method.

6. The vaporizable source material container according to claim 1, further comprising a valve arranged at a portion of a gas flow path located more downstream than the mixed gas outlet, the valve being a vacuum valve having a CV value in terms of water of 0.2 or more.

7. A solid vaporization/supply system comprising:

the vaporizable source material container according to claim 1;

and the metal halide for thin film deposition to be used as the vaporizable source material that is stored in the vaporizable source material container, wherein the carrier gas is supplied from the carrier gas inlet of the lid body, and a mixed gas obtained by mixing the vaporized metal halide for thin film deposition with the carrier gas is supplied from the mixed gas outlet of the lid body.

8. The solid vaporization/supply system according to claim 7, wherein the mixed gas is produced by:

charging the metal halide for thin film deposition into the vaporizable source material container;

heating the metal halide for thin film deposition in the container main body by heating the container wall of the container main body;

introducing a carrier gas from the carrier gas inlet of the lid body, making the carrier gas pass through a space between the inner wall and outer wall constituting the double wall structure of the heated container wall, and introducing the carrier gas thus heated into the container main body; and mixing the vaporized metal halide for thin film deposition with carrier gas.

9. The solid vaporization/supply system according to claim 7, wherein a valve for opening and closing the gas flow path is arranged at a portion of a gas flow path for the mixed gas located more downstream than the mixed gas outlet, and wherein the valve is a vacuum valve having a CV value in terms of water of 0.2 or more.

* * * * *